(12) United States Patent
Huo et al.

(10) Patent No.: US 10,475,807 B2
(45) Date of Patent: Nov. 12, 2019

(54) THREE-DIMENSIONAL MEMORY DEVICE AND MANUFACTURING METHOD THEREOF

(71) Applicant: Institute of Microelectronics, Chinese Academy of Sciences, Chaoyang District, Beijing (CN)

(72) Inventors: Zongliang Huo, Beijing (CN); Ming Liu, Beijing (CN); Lei Jin, Beijing (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 2 days.

(21) Appl. No.: 15/503,833

(22) PCT Filed: Sep. 25, 2014

(86) PCT No.: PCT/CN2014/087478
§ 371 (c)(1),
(2) Date: Feb. 14, 2017

(87) PCT Pub. No.: WO2016/023260
PCT Pub. Date: Feb. 18, 2016

(65) Prior Publication Data
US 2017/0236836 A1    Aug. 17, 2017

(30) Foreign Application Priority Data

Aug. 15, 2014   (CN) .......................... 2014 1 0404550

(51) Int. Cl.
*H01L 27/11578* (2017.01)
*H01L 27/11582* (2017.01)
*H01L 49/02* (2006.01)

(52) U.S. Cl.
CPC .. *H01L 27/11582* (2013.01); *H01L 27/11578* (2013.01); *H01L 28/00* (2013.01)

(58) Field of Classification Search
None
See application file for complete search history.

(56) References Cited

U.S. PATENT DOCUMENTS

2009/0310425 A1   12/2009   Sim et al.
2010/0193861 A1   8/2010    Shim et al.
(Continued)

*Primary Examiner* — Fazli Erdem
*Assistant Examiner* — Scott R Wilson
(74) *Attorney, Agent, or Firm* — Dickinson Wright PLLC

(57) ABSTRACT

A method for manufacturing three-dimensional memory, comprising the steps of: forming a stack structure composed of a plurality of first material layers and a plurality of second material layers on a substrate; etching the stack structure to expose the substrate, forming a plurality of first vertical openings; forming a filling layer in each of the first openings; etching the stack structure around each of the first openings to expose the substrate, forming a plurality of second vertical openings; forming a vertical channel layer and a drain in each of the second openings; removing the filling layer by selective etching, re-exposing the first openings; partially or completely removing the second material layers by lateral etching, leaving a plurality of recesses; forming a plurality of gate stack structure in the recesses; forming a plurality of common sources on and/or in the substrate at the bottom of each of the first openings. In accordance with the three-dimensional memory manufacturing method of the present invention, the deep trenches of word-line in the TCAT three-dimensional device are replaced with deep-hole etching to realize the same function, thereby improving the integration density, simplifying the etching process of stacked structure, and maintaining the control performance of the metal gate.

12 Claims, 4 Drawing Sheets

(56) References Cited

U.S. PATENT DOCUMENTS

| | | | |
|---|---|---|---|
| 2012/0077320 A1* | 3/2012 | Shim | H01L 27/11582 |
| | | | 438/269 |
| 2012/0098050 A1 | 4/2012 | Shim et al. | |
| 2013/0009236 A1 | 1/2013 | Lee et al. | |
| 2013/0214344 A1* | 8/2013 | Lim | H01L 29/792 |
| | | | 257/324 |
| 2013/0248974 A1 | 9/2013 | Alsmeier et al. | |
| 2014/0239375 A1* | 8/2014 | Kim | H01L 29/66833 |
| | | | 257/324 |
| 2015/0001460 A1* | 1/2015 | Kim | H01L 27/11578 |
| | | | 257/5 |
| 2015/0079743 A1* | 3/2015 | Pachamuthu | H01L 27/11551 |
| | | | 438/268 |

* cited by examiner

THREE-DIMENSIONAL MEMORY DEVICE AND MANUFACTURING METHOD THEREOF

CROSS-REFERENCE TO RELATED APPLICATIONS

The present application is a 35 U.S.C. Section 371 national stage filing of International Patent Application No. PCT/CN2014/087478, filed 25 Sep. 2014, and through which priority is claimed to Chinese Patent Application 201410404550.X, filed 15 Aug. 2014, the disclosures of which are incorporated herein by reference in their entireties.

TECHNICAL FIELD

The present invention relates to a semiconductor device and manufacturing method thereof, particularly to a high-density three-dimensional memory device and manufacturing method thereof.

BACKGROUND TECHNIQUE

In order to improve the density of the memory device, the industry has worked extensively at developing a method for reducing the size of a two-dimensional arrangement of memory cells. As the size of the memory cells of the two-dimensional (2D) memory devices continues to shrink, signal conflict and interference will increase so significantly that it is difficult to perform operation of multi-level cell (MLC). In order to overcome the limitations of 2D memory device, the industry has developed a memory device having a three-dimensional (3D) structure to improve the integration density by way of arranging the memory cells three-dimensionally on the substrate.

One of the common 3D memory device structures used in current industry is terabit cell array transistor (TCAT). Specifically, a multilayer laminated structure (e.g., a plurality of ONO structures of alternating oxide and nitride) may firstly deposited on the substrate; etching the multilayer laminated structure on the substrate by an anisotropic etching process, a plurality of channel through-holes distributed along the extending direction of the word line (WL) of memory cell and perpendicular to the substrate surface are formed (may extend through to the substrate surface or with a certain over-etch); a plurality of pillar-shaped channels are formed by depositing materials such as polysilicon etc. in the channel through-holes; the multilayer laminated structure is etched along the WL direction to form a plurality of trenches extending through to the substrate, exposing the multilayer stack surrounding the pillar-shaped channels; considering the etching selectivity of adjacent layers in the stack, using the etching solution with relatively greater ratio of etching selectivity to remove the second type of material in the stack by wet etching, leaving a plurality of projecting structures made of the first type of material laterally distributed around the pillar-shaped channels; a gate dielectric layer made of high-k dielectric materials and a gate stack structure composed of metal gate conductive layers are deposited on sidewalls of the projecting structures in the trenches; the laminated structure is etched to form a plurality of source/drain contacts, and the rear end of the manufacturing process is completed. Here, a portion of projecting structures of the laminated structure leaving on the sidewall of pillar-shaped channels forms a plurality of spacers between the gate electrodes, leaving the gate stacks sandwiched between the spacers as control electrodes. When a voltage is applied to the gates, the fringe field of the gate will enable a plurality of source and drain regions to be induced on sidewalls of pillar-shaped channels made of e.g. polysilicon material, thereby constituting a gate array composed of a plurality of flash memory cells series-parallel coupled to record the stored logic states. Wherein, in order to extract the signals of a plurality of MOSFETs series-parallel coupled in the cell region, the drain regions are formed by deposition filling the top of the pillar-shaped channel with polycrystalline silicon material, and the metal contact plugs electrically connected to the drain regions are also formed to establish further electrical connection to the bit-line (BL) thereon. In addition, a common source region containing metal silicide contacts is formed in the substrate between a plurality of vertical pillar-shaped channels. Under the conductive condition of the cell, the current flows from the common source region to the vertical channel region around, upwardly passes through a plurality of induced source and drain regions induced in the vertical channel under the influence of the control voltage applied on the control gate (connected to the word line), and further flows to the bit-line thereon through the drain region on the top of the channel.

The TCAT device structure has many advantages such as body-erase (adjusting the control gate can cause change of the electric potential in the induced source/drain regions and the floating gate, which can be erased in its entirety) and metal gate (it can be more convenient to adjust the transistor threshold through controlling the work function of the metal material) and so on. However, on the other hand, since that all the gate and word line (WL) connections are shared link through etching holes, except the top select transistor (USG, located above the memory transistor cell strings), and the gate-last process is used for etching to remove a dummy gate and form a gate opening as well as deposit a metal gate, such deep contact hole and gate opening with extremely high aspect ratio (AR, for example, typically greater than 40:1 and even 100:1) will have increasing width due to the deposition of the multilayer films, thereby the density of the TCAT memory cell cannot be further reduce effectively. Meanwhile, the etching for both of the deep trenches and the deep hole channels are etching for multilayer stack, with great process complexity, and the shape difference from deep holes to deep trenches requires the change of the etching processes.

Compared to the TCAT technology, another common device structure is for example NAND configuration using the BiCS (bit cost can be reduced), the integration density is improved by disposing the memory cells on the substrate three-dimensionally, wherein the channel layer is vertically erected on the substrate, the gate is divided into three parts, namely a lower selection gate layer, a middle control gate layer and an upper selection gate layer, the crosstalk between signals can be reduced by distributing the gate signals into three groups of the gate electrodes. Specifically, the devices in the top and bottom layer are used as select transistors—vertical MOSFET with larger gate height/thickness, the gate dielectric layer is a single layer of conventional high-k material; the devices in the middle layer are used as a memory cell string, with smaller gate height/thickness, the gate dielectric layer has stack structure composed of a tunneling layer, a storage layer and a barrier layer. The specific manufacturing processes of the device with the BiCS-based NIND structure generally include, depositing the lower selection gate electrode layer on a silicon substrate, etching the lower selection gate electrode layer to form trenches through to the substrate for further deposition of the lower portion of channel layer and the lead-out contact of the lower gate electrode, depositing the control gate layer over the lower selection gate electrode layer, etching the control gate layer to form an intermediate channel region used for memory cell region and to create the lead-out contact for the middle control gate electrode, etching the control gate, dividing the whole device into a plurality of regions according to the word- and bit-line dividing requirements, depositing the upper selection gate layer over the control gate layer and etching it, depositing to form the upper channel and the upper lead-out contact, then completing the device fabrication through the subsequent processes. In the BiCS structure, except for the top select transistor USG, all of the gate electrodes beneath can be flat-shaped, which can avoid the contact process for deep trenches and deep holes for the TCAT, leading to the improvement of the memory density. In such process, the most critical etching step is merely the lithography of memory channel region and lead-out contact in the intermediate layer, which directly determines the integration density and signal anti-jamming capability of the whole device. However, although the BiCS structure can respectively use the control gate threshold through the stacked placement of the storage array and select transistors, also can avoid the complex process of the contact holes or gate openings with too large aspect ratio through the stratification of gate connections, it can only do erasing by polysilicon gate induced drain-leaked current (GIDL), without capability of body-erase, which results in low read-write efficiency.

SUMMARY OF THE INVENTION

As described above, an object of the invention lies to overcome the above-mentioned technical difficulties, and proposes an innovative a 3-D memory structure manufacturing method which can realize contact interconnection with low cost and maintain the control performance of the metal gate.

To this end, in one aspect of the present invention, there is provided a method for manufacturing three-dimensional memory, comprising the steps of: forming a stack structure composed of a plurality of first material layers and a plurality of second material layers on a substrate; etching said stack structure to expose the substrate, forming a plurality of first vertical openings; forming a filling layer in each of the first openings; etching the stack structure around each of the first openings to expose the substrate, forming a plurality of second vertical openings; forming a vertical channel layer and a drain in each of the second openings; removing the filling layer by selective etching, re-exposing the first openings; partially or completely removing the second material layer by lateral etching, leaving a plurality of recesses; forming the gate stack structure in the recesses; forming a plurality of common sources on and/or in the substrate at the bottom of each first openings.

Wherein, the first material layer, the second material layer and the filling layer have etching selectivity different from each other.

Wherein, the materials of the first material layer, the second material layer and the filling layer are selected from any one of silicon oxide, silicon nitride, silicon oxynitride, amorphous silicon, amorphous germanium, DLC, amorphous carbon and the combinations thereof.

Wherein, the size of the first openings is greater than or equal to that of the second openings.

Wherein, the channel layer is a hollow structure comprising an insulator in the center.

Wherein, after forming the common sources, further comprising forming an insulating layer on sidewalls of each of the first openings, forming a contact layer contacting the common source regions on sidewalls of the insulating layer and at the bottom of each of the first openings.

Wherein, during or after forming the contact layer, further comprising controlling the deposition process parameters or etching back to ensure that the top surface of the contact layer is lower than the bottom of the topmost layer of the gate stack structure, and backfilling with the insulating layer.

Wherein, after forming the contact layer, further comprising partially removing the first material layers and the gate stack structure by etching to form a plurality of third openings, depositing the insulating material in the third openings to form an isolation insulating region between the topmost layers of the gate stack structures.

Wherein, after forming the isolation insulating region, further comprising forming an interlayer dielectric layer on the device, etching the interlayer dielectric layer to form a plurality of fourth openings until the contact layer is exposed, filling with metal to form a common source wiring.

Wherein, after forming a contact plug of the common source line, further comprising forming a second interlayer dielectric layer on the device, etching the second interlayer dielectric layer to form a plurality of fifth openings until the channel region is exposed, filling with metal to form a bit-line contact.

Wherein, before forming the first openings by etching, further comprising etching the stack structure in the word-line contact region surrounding the array area to form stairs, sequentially exposing the ends of each first material layers and second material layers.

In another aspect of the invention, there is provided a method for manufacturing three-dimensional memory, comprising the steps of: forming a stack structure composed of a plurality of first material layers and a plurality of second material layers on a substrate; etching said stack structure to expose the substrate, meanwhile forming a plurality of vertical first openings as well as a plurality of second openings around each of the first openings; forming a filling layer in each of the first openings; forming a vertical channel layer and drain in each of the second openings; removing the filling layer by selective etching, re-exposing the first openings; partially or completely removing the second material layer by lateral etching, leaving a plurality of recesses; forming the gate stack structure in each of the recesses; forming a common source on and/or in the substrate at the bottom of each of the first openings.

In yet another aspect of the present invention, there is provided a three-dimensional memory, comprising: a plurality of common source wirings in the vertical distribution on the substrate, contacting with the common sources in and/or on the substrate; a plurality of channel layers surrounding each of the common source wirings, distributed perpendicularly to the substrate, having a drain on the top of each channel layer; a plurality of insulating isolating layers on sidewalls of each channel layer and a plurality of gate stack structure between the insulating isolating layers.

In accordance with the three-dimensional memory manufacturing method of the present invention, the deep trenches of word-line in the TCAT three-dimensional device are replaced with deep-hole etching to realize the same function, thereby improving the integration density, simplifying the etching process of stacked structure, and maintaining the control performance of the metal gate.

BRIEF DESCRIPTION OF THE DRAWINGS

Referring to the following drawings, the technical solutions of the present invention are described in detail, in which.

DETAILED DESCRIPTION

The features and technical effects of the present invention will be described in detail with reference to the drawings and schematic embodiments, disclosing an innovative method for manufacturing 3-D memory structure which can realize contact interconnection with low cost and maintain the control performance of the metal gate. It should be noted that the similar reference numbers denote the similar structure. The terms used in the present invention like "first", "second", "up/upon", "down/low/beneath/under" etc. can be used in denoting various device structures, and do not indicate the relationship in space, sequence or hierarchy of the device structures unless specially illuminated these terms, if not stated otherwise.

Figure 1:
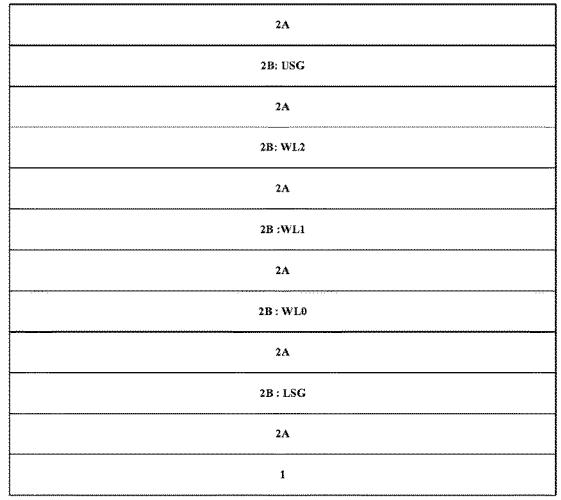
FIGS. 1 to 10 are cross-sectional views and/or top views of the various steps of the method for manufacturing 3-D semiconductor memory in accordance with the present invention.

As shown in FIG. 1, a stack structure 2 composed of a plurality of first material layers 2A and a plurality of second material layers 2B is formed alternately on the substrate 1. The material of substrate 1 may comprise bulk silicon (bulk Si), bulk germanium (bulk Ge), silicon-on-insulator (SOI), germanium-on-insulator (GeOI), or other compound semiconductor substrate, e.g., SiGe, SiC, GaN, GaAs, InP and the like, and combinations of these substances. For compatibility with the existing IC fabrication process, the substrate 1 is preferably a substrate containing silicon material, e.g., Si, SOI, SiGe, Si:C and the like. The material of the stack structure 2 is selected from combination of the following material and comprises at least one insulating dielectric: e.g. silicon oxide, silicon nitride, amorphous carbon, diamond-like amorphous carbon (DLC), germanium oxide, aluminum oxide or the like and combinations thereof. The first material layers 2A have a first etch selectivity, and the second material layers 2B have a second etch selectivity which is different from the first etch selectivity (e.g., the etching selectivity ratio of two materials is greater than 5:1 and preferably greater than 10:1). In one preferred embodiment of the invention, laminate structure 2A/2B are both nonconductive material, and the combination of layers 2A/2B is a combination of silicon oxide and silicon nitride, a combination of silicon oxide and (undoped) polysilicon or amorphous silicon, a combination of silicon oxide or silicon nitride and amorphous carbon and the like, for example. In another preferred embodiment of the invention, the layers 2A and layers 2B have a relatively greater etching selectivity ratio at wet etching conditions or oxygen plasma dry etching conditions (for example greater than 5:1). The method for depositing layers 2A, 2B comprises PECVD, LPCVD, HDPCVD, MOCVD, MBE, ALD, thermal oxidation, evaporation, sputtering, and other processes. In one of the most preferred embodiment of the invention, layers 2A are made of silicon dioxide, layers 2B are made of silicon nitride. As shown in FIG. 1, the bottommost layer 2B is used for the future formation of the select gate electrode at the lowest layer, and therefore it is labeled as LSG, while the topmost layer 2B is used for the future formation of the select gate electrode at the uppermost layer, and therefore it is labeled as USG, there are a plurality of layers 2B in the middle with labels from WL0 to WLn to form n+1 bit lines. FIG. 1 only shows the case of n=2, however, n can be actually any positive integer greater than or equal to 1 as desired.

Figure 2A:
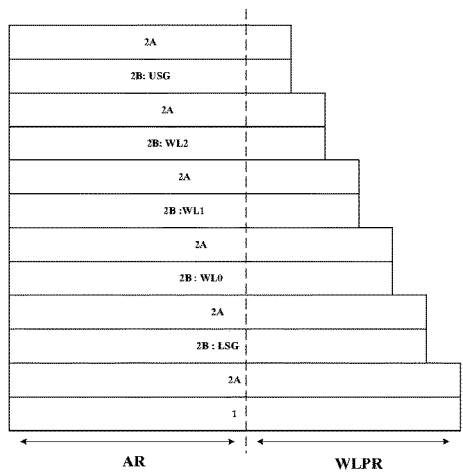
Figure 2B:
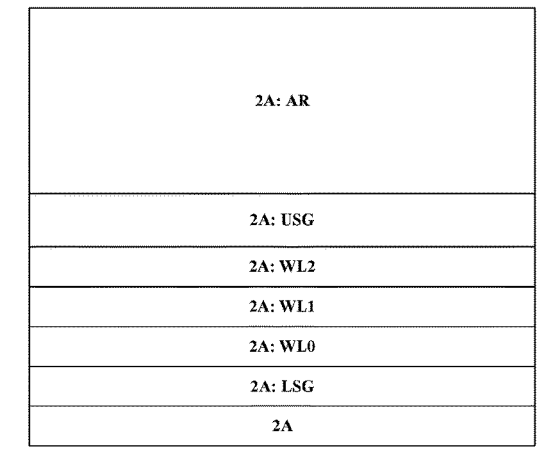
Figures 3A, 3B:
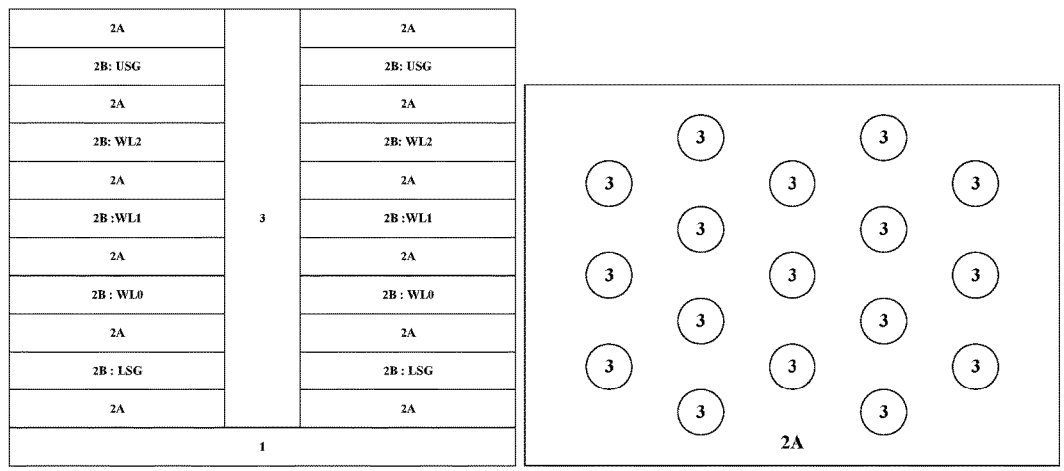

Optionally, as shown in the cross-sectional view 2A and the top view 2B included in FIG. 2, the stacked structure 2A/2B is etched, sequentially exposing part of the side end of the layer 2A/2B to form a step-like WL-Pad Region (WLPR), with the array region (AR) being located in the central region. Wherein, in the WLPR region, layer 2A: USG above the top layer USG, layer 2A: WL2 used for WL2 above the layer 2B, layer 2A: WL1 used for WL1 above the layer 2B, layer 2A: WL0 used for WL0 above the layer 2B, layer 2A: LSG used for LSG above the layer 2B, and layer 2A protecting substrate 1 are sequentially exposed. The steps shown in the following FIGS. 3 to 10 will perform for the central array region shown in FIG. 2, in other words, the various top views only show part of the region 2A:AR.

In current method for manufacturing TCAT structure, usually after etching deep trench and depositing channel material like polysilicon to form the channel, the dummy gate (SiN) of layers 2B are exposed via implementing deep trench etching, then the dummy gate (SiN) of layers 2B is removed and the steps of depositing the gate stack dielectric layer and the metal electrode are completed, thereby the preparation of memory cells is finished; thereafter, the formation of the common source region is completed through sidewall technology, implantation and silication; then through filling deep trenches with oxide and CMP process, followed by etching and filling the contact holes of the common source region CSL, as well as the metal wire connection, the CSL connection is completed. As mentioned in the section of background technique, these deep trenches formed later are often difficult to balance the aspect ratio and the metal filling rate, and easily lead to device invalidation.

By contrast, in one embodiment of the present invention, the deep trenches are replaced by deep holes etching as shown in FIG. 3, so that the process is similar to the channel formation process, after completing the preparation of the memory cells, the contacts of the common source regions are completed directly by the sidewall technology, silication and metal deep hole filling, thereafter the CSL connection is completed. Comparatively, the etching process of multilayer dielectric is simple, the density of storage arrays increases, the contact hole extraction process of the common source region is simplified. The conventional methods which include filling deep trenches with silicon dioxide, then flattening, etching and then filling contact holes are directly replaced by the insulating layer on sidewalls of deep holes and filling the metal contact holes.

As shown in FIG. 3 which includes a cross-sectional view 3A and a top view 3B, the stack structure 2 is etched in the array region (this region will be used to form the future common source region) until the substrate 1 is exposed, a plurality of first openings (not shown) are formed as dummy gate opening, and a filling layer 3 is formed in the dummy gate openings. In later steps shown in FIG. 5, the first openings are used as entrance region for forming the common source regions 1S and removing part of layers 2B by lateral etching. Preferably, RIE or plasma dry etching is used for anisotropically etching the stack structure 2 composed of layers 2A/2B, forming the first openings (not shown) exposing substrate 1 and the sidewall of layers 2A/2B alternately stacked thereon. The etching gas is for example fluorocarbon-based etching gas for materials such as silicon dioxide, silicon nitride, and etc., and a temporary protecting sidewall composed of polymer containing C is formed on the sidewall by increasing the fluorocarbon ratio, ultimately, a good vertical sidewall is obtained. In a preferred embodiment of the present invention, the etching gas is preferably the gas with high C content such as C3F6, C4F8, etc., and further preferably controls the sidewall morphology by adding an oxidizing gas such as O2, CO and like. The cross-sectional shape of the trenches formed by cutting parallel to the surface of substrate 1 may be various geometric shapes selected from rectangular, square, diamond, circular, semi-circular, elliptical, triangular, pentagonal, hexagonal, or octagonal, and etc. The deposition method of the filling layer 3 comprises PECVD, HDPCVD, MOCVD, MBE, ALD, evaporation, sputtering, etc., of which the material preferably has a high selectivity with respect to both layers 2A and 2B of the stack structure 2, e.g., the etching selectivity ratio of any two of the three namely layer 3, layer 2A and layer 2B, is greater than or equal to 5:1. In one preferred embodiment of the present invention, layers 2A are made of silicon oxide, layers 2B are made of silicon nitride, the filling layer is made of amorphous silicon, amorphous germanium, amorphous carbon, DLC, etc., and vice versa.

Figures 4A, 4B:
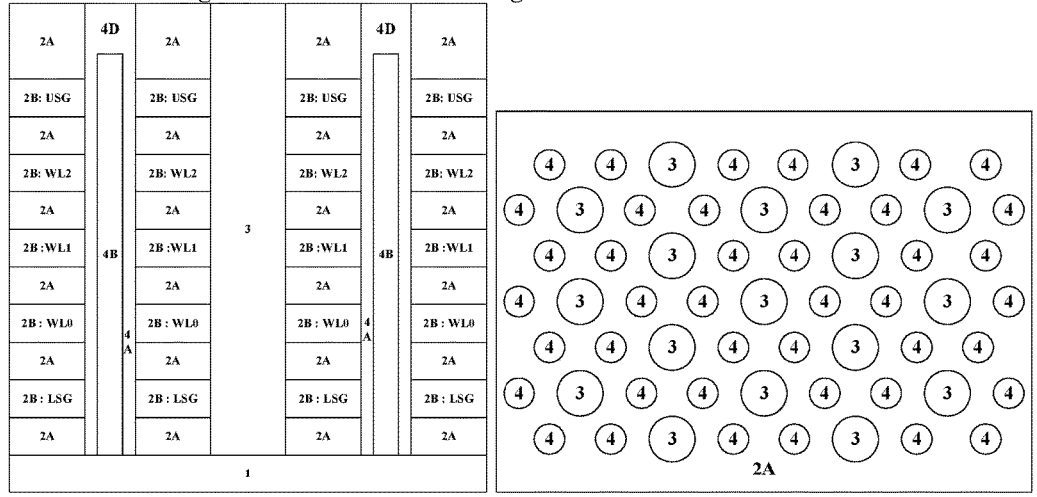

Then, as shown in FIG. 4 which includes a cross-sectional view 4A and a top view 4B, a plurality of the second openings are formed by etching around each of the first openings and the vertical channel regions 4 are also formed. Similar to the process of etching and forming the first opening, RIE or plasma dry etching is used for anisotropically etching the stack structure 2 composed of layers 2A/2B, forming a plurality of the second openings (not shown) around the first openings, exposing substrate 1 and the sidewall of layers 2A/2B alternately stacked thereon. The etching gas is for example fluorocarbon-based etching gas for materials such as silicon dioxide, silicon nitride, and etc., and a temporary protecting sidewall composed of polymer containing C is formed on the sidewall by increasing the fluorocarbon ratio, ultimately, a good vertical sidewall is obtained. In a preferred embodiment of the present invention, the etching gas is preferably the gas with high C content such as C3F6, C4F8, etc., and further preferably controls the sidewall morphology by adding an oxidizing gas such as O2, CO and like. As shown in FIGS. 4A and 4B, the size (e.g., diameter) of the first openings used for exposing the common source region is greater than or equal to that of the second openings used for forming the channel region, for example, the ratio of two sizes (the ratio of diameter or the ratio of the maximum span of a polygon) is greater than 1:5 and preferably greater than or equal to 2. In one embodiment of the invention, there are six second openings around each of the first openings, in order to improve the efficiency and uniformity of subsequent lateral etching of layers 2B. In other embodiments of the present invention, the number of the second openings around each of the first openings may be 2, 3, 4, 5, 6, 7, 8, 9 or even more.

Thereafter, a plurality of vertical channel layers 4 are formed in the second openings. The material of the channel layers 4 may include semiconductor materials such as monocrystalline silicon, monocrystalline germanium, SiGe, Si:C SiGe:C, SiGe:H and the like, the deposition process comprises LPCVD, PECVD, HDPCVD, MOCVD, MBE, ALD, etc. In one embodiment of the present invention, the deposition process of channel layers 4 is partially filling the sidewalls of the second openings to form hollow cylinders with air gaps. In other embodiments of the present invention, the deposition process of channel layers 4 is chosen to completely or partially filling the second openings, thereby forming a plurality of solid columns, hollow rings, or core-shell structures having hollow rings with filled insulating layer (not shown). The shape of the horizontal cross section of channel layers 4 is similar and preferably conformal to those of the second openings, and can be various solid geometric shapes, such as rectangle, square, diamond, circular, semi-circular, elliptical, triangular, pentagonal, hexagonal, or octagonal and etc., or annular or tubular hollow structures evolved from geometric shapes described above (and its interior may be filled with insulating layers). Preferably, for the structure of hollow pillar-shaped channel layers 4, it can be further filled with an insulating spacer layers 4B inside the channel layers 4A, for example, a silicon oxide layers 4B can be formed by process such as LPCVD, PECVD, HDPCVD, etc., for supporting, insulating and isolating the channel layers 4A. Thereafter, drain regions 4D are deposited at the top of the channel layers 4. Preferably, the drain regions 4D of memory device cell transistors are formed by depositing materials as same as or similar to those of channel layers 4 (e.g., materials similar to Si, such as SiGe, SiC, etc., in order to fine-tune the lattice constants and improve the carrier mobility, thereby controlling the driving performance of cell components) on top of the second openings, and a silicide (not shown) may further be formed in order to reduce the contact resistance.

As shown in the cross-sectional view 5A and the top view 5B, the filling layer 3 is selectively etched away, re-exposing the first opening 2T, through the first opening 2T, the second material layers (dummy gate layer) 2B in the stack structure are removed by lateral etching. Firstly, using vertical anisotropic etching process such as RIE or plasma dry etching process (further improving the fluorocarbon ratio in order to etch amorphous silicon and amorphous germanium, or using the oxygen plasma dry etching to remove the filling layer 3 made of amorphous carbon or DLC material), or with respect to the material of the filling layer 3, using etching solution basically or completely incapable of etching layers 2A,2B to remove layer 3 by wet etching (e.g., for layer 3 made of an amorphous silicon material, using TMAH etching solution). Removing the filling layer 3 completely by vertical anisotropic etching process, the wider vertical first openings 2T are re-exposed. Then, using an isotropic dry etching process, removing layers 2B by lateral etching, lateral recesses 2R are leaved between layers 2A. For example, the layers 2B made of silicon nitride are laterally etched by reduced fluorocarbon ratio, or corroded by hot phosphoric acid. Alternatively, when layers 2A are made of silicon nitride and layers 2B are made of silicon oxide, the HF-based etching solution can be employed to corrode layers 2B.

Figure 6:
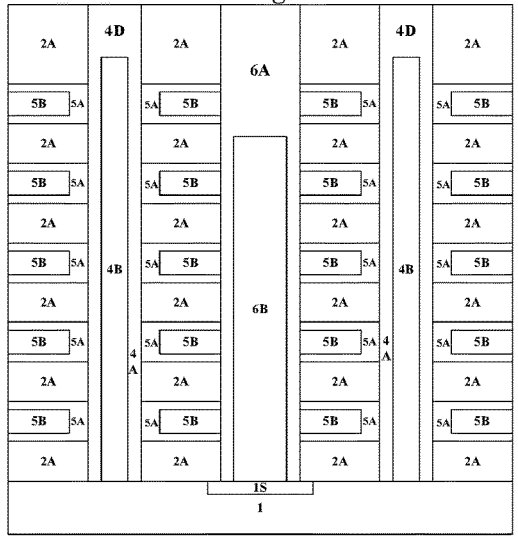

As shown in FIG. 6, a plurality of common source regions 1S are formed at the bottom of the first opening 2T, and a plurality of gate stack structures 5A/5B are formed in the recesses 2R. The source regions 1S can be formed by doping with ionic injected, and preferably by forming metal silicides (not shown) on the surface. The metal silicides are such as NiSi2-y, Ni1-xPtxSi2-y, CoSi2-y or Ni1-xCoxSi2-y, wherein the x is greater than 0 and less than 1, and the y is greater than or equal to 0 and less than 1. The gate stack structure 5 includes a gate insulating layer 5A and a gate conductive layer 5B. The deposition method of layer 5A comprises PECVD, HDPCVD, MOCVD, MBE, ALD, evaporation, sputtering or the like. The figure does not show that layer 5A preferably further comprises a plurality of sub-layers, e.g., a tunneling layer, a storage layer, and a barrier layer. Wherein the tunneling layer composes SiO2 or high-k material, wherein the high-k materials include, but are not limited to nitride (such as SiN, SiON, AlN, TiN), metal oxides (mainly subgroup and lanthanide metal element oxides, such as MgO, Al2O3, Ta2O5, TiO2, ZnO, ZrO2, HfO2, CeO2, Y2O3, La2O3), oxynitrides (e.g., HfSiON), perovskite phase oxide (e.g. PbZrxTi1−xO3 (PZT), BaxSr1−xTiO3(BST)), etc., and the tunneling layer may be monolayer or multilayer stacked structure of the above materials. The memory layer is made of dielectric material with charge trapping capability, e.g., SiN, HfO, ZrO, etc., and combinations thereof, also may be the monolayer structure or multilayer stacked structure of the above materials. The barrier layer may be monolayer or multilayer stacked structure of dielectric materials such as silicon oxide, aluminum oxide, hafnium oxide and etc. In one embodiment of the present invention, layer 5A is for example ONO structure composed of silicon oxide, silicon nitride, and silicon oxide.

The gate conductive layer 5B may be polycrystalline silicon, a polycrystalline silicon-germanium, or metals, wherein the metals may comprise metal elements such as Co, Ni, Cu, Al, Pd, Pt, Ru, Re, Mo, Ta, Ti, Hf, Zr, W, Ir, Eu, Nd, Er, La and the others, or alloys of these metals and the nitrides of these metals, and the gate conductive layer 5B may also be doped with C, F, N, O, B, P, As and other elements to adjust the work function. A nitride barrier layer (not shown) is preferably formed between the gate dielectric layer 5A and the gate conductive layer 5B by PVD, CVD, ALD and other conventional processes, the material of the barrier layer includes MxNy, MxSiyNz, MxAlyNz, MaAlxSiyNz, wherein the M is Ta, Ti, Hf, Zr, Mo, W, or other elements. Likewise, layer 5B may be a monolayer structure, or also be a multilayer stacked structure.

Furthermore, as shown in FIG. 6, a thin insulating layer 6A is formed on sidewalls of the first openings 2T, and then the insulating layer 6A is filled with metal to form a source contact 6B. The insulating layer 6A can be form by process such as thermal oxidation, chemical oxidation, PECVD, HDPCVD and the like, the material can be silicon oxide, silicon nitride, or high-K material. Layer 6A preferably covers only the sidewall of the first opening 2T, the thinner portion stacked at the bottom can be removed using wet etching process or isotropic dry etching process, similar to the sidewall technology. Thereafter, using process such as MOCVD, MBE, ALD, evaporation, sputtering and the like to form a common source contact line 6B having low resistance, also named as CSL. Preferably, using CMP or etch-back method, or adjusting metal deposition process parameters, reducing the height of layer 6B to ensure its top is lower than the bottom of the top gate stack structure 5A/5B (the top metal gate structure is used for the top select gate line USG of the top select transistor), and then back-filling the insulating layer 6A until its height is equal to that of the topmost layer 2A.

Figure 7A:
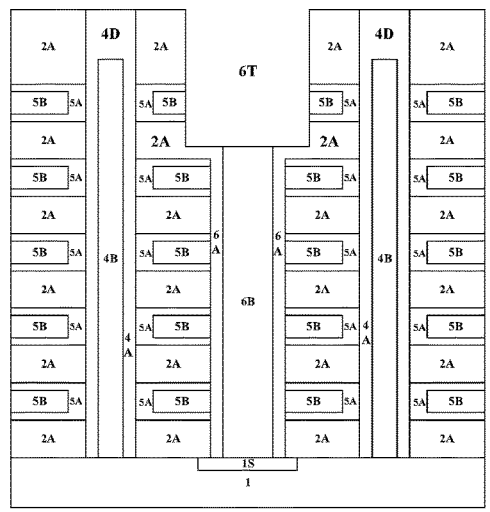
Figure 7B:
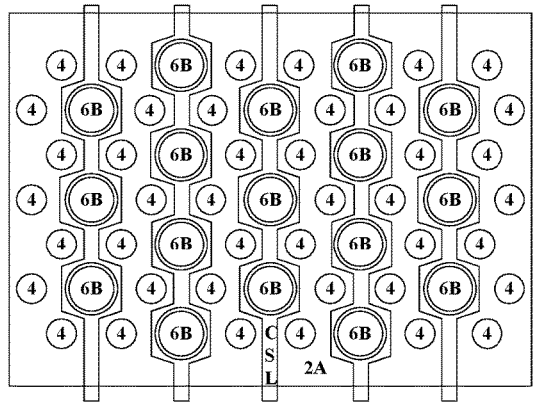

Thereafter, preferably, as shown in the cross-sectional view 7A and the top view 7B, the insulating layer 6A on the top of the CSL layer 6B is removed by etching, and the layer 6B beneath is exposed. In this etching step, the size of the third openings 6T formed by etching is greater than that of the first openings 2T (e.g., the diameter of a circular or the maximum span of a polygon), a part of the gate stack structures 5A/5B at the USG layer are removed. As shown in FIG. 7B, the patterns of the common source contact line CSL are connected to a plurality of the third openings 6T, and may further extend beyond the memory cell region to have connection with an external circuit, thereby to form interconnections.

Figure 8:
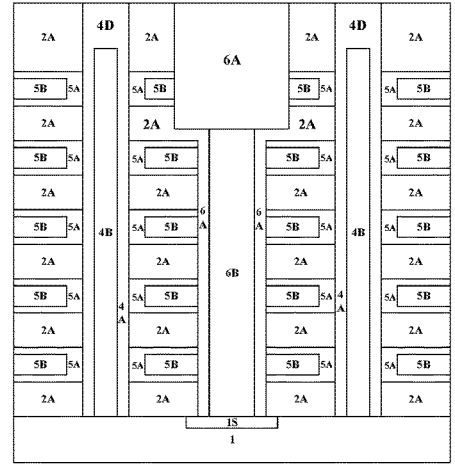

As shown in FIG. 8, the third openings 6T are filled with the same insulating layer 6A, and the isolation insulating regions of the top layer select gate line are formed.

Figure 9:
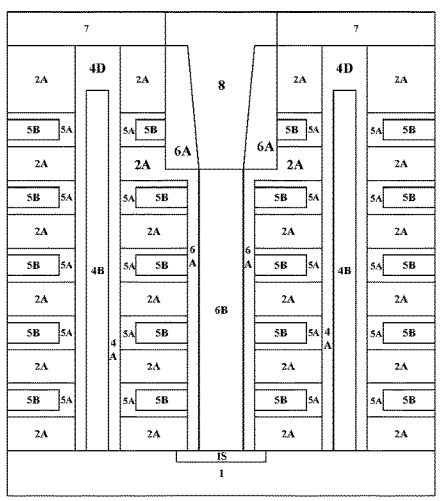

As shown in FIG. 9, an interlayer dielectric layer (ILD) 7 is formed over the entire device. For example, using process such as spraying coating, spin coating, CVD deposition and the like, ILD7 made of low-k material is formed, the low-k materials include but are not limited to organic low-k material (e.g. an aromatic group or a polycyclic organic polymer), inorganic low-k material (e.g. amorphous CN thin film, polycrystalline boron-nitrogen film, fluorinated silicate glass, BSG, PSG, BPSG), porous low-k material (such as dimethyl silicone three siloxane (SSQ) based porous low-k material, porous silica, porous SiOCH, mixed C silica, F-doped amorphous porous carbon, porous diamond, porous organic polymer). Thereafter, the ILD 7 is etched to expose CSL layer 6B, the fourth opening (not shown) is formed and the contact plug 8 is also formed by depositing metal material, connecting to the common source region 15 of the array.

Figure 10A:
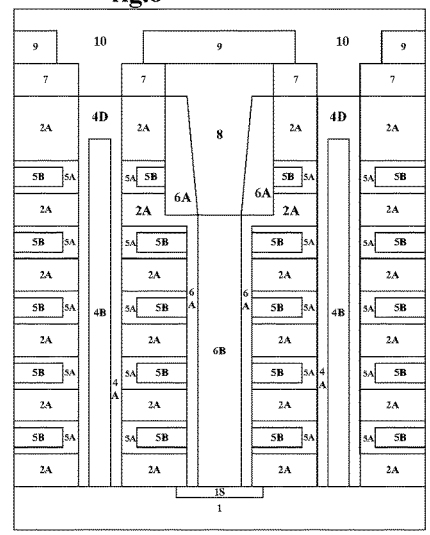
Figure 10B:
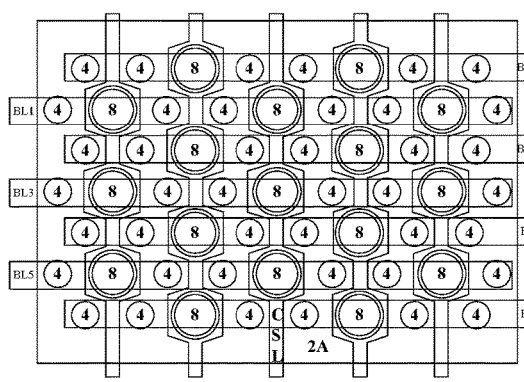

As shown in FIGS. 10A and 10B, the bit-line connection is completed. The second ILD 9 is deposited over the first ILD 7 using similar processes and materials, and the contact hole exposing the channel regions 4D is formed by etching, the metal is deposited to form the bit-line connection 10.

It is worthily noted that, FIGS. 1 to 10 only show the process according to one embodiment of the invention, the present invention can use other process to complete the manufacturing of three-dimensional memory device. For example, in a preferred alternative embodiment of the present invention, the first openings used for the common source region and the second openings used for the channel region shown in FIGS. 3B and 4B can be realized through one-time photolithography/etching patterning, i.e. the processes shown in FIG. 3 and FIG. 4 can be combined, as long as there are a plurality of the second openings around each of the first openings. In another alternative embodiment of the invention, after the performing of filling the gate stack structure is completed as shown in FIG. 6, the etching process is performed according to the layout shown in FIGS. 7B and 10B during the wiring stage shown in FIGS. 7A and 7B and thereafter, the isolation between the gate layers (the pattern of the isolation layer 6A surrounding the metal layer 6B in the center) is completed, and the pattern of the common source line CSL is formed. Specifically, after completing the gate stack deposition in the etched holes, then filling dielectric, and then the entire plane is flattened, followed by physically etching the area labeled by CSL as shown in FIG. 10B, similar to the steps of WL-Cut in the TCAT process, depositing thin dielectric layer sidewall, and then the metal or other conductive layer is deposited to form a conductive surface of the common source region. The advantage is that, in previous example all the WL are not isolated except the USG isolation, this method can realize the isolation of all WL layers exactly the same as TCAT.

Figure 5A:
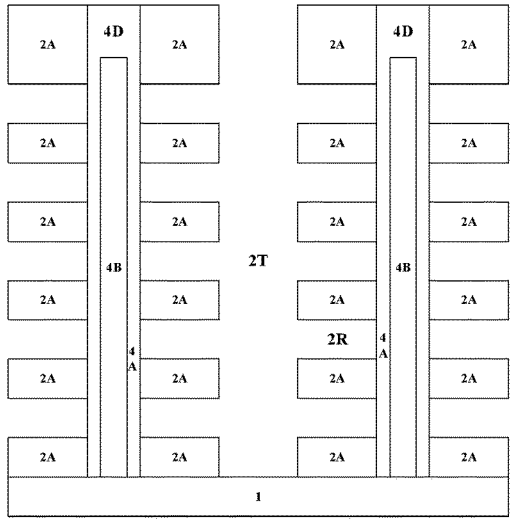
Figure 5B:
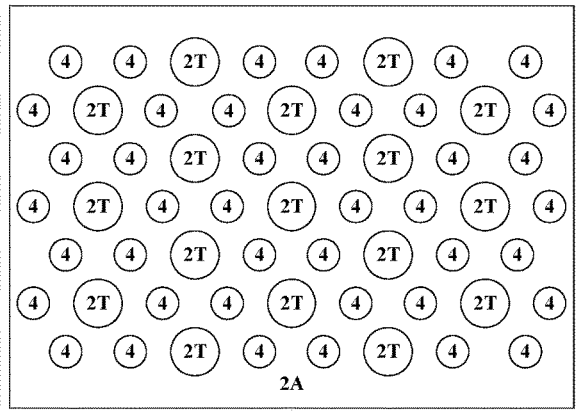
Figure 10C:
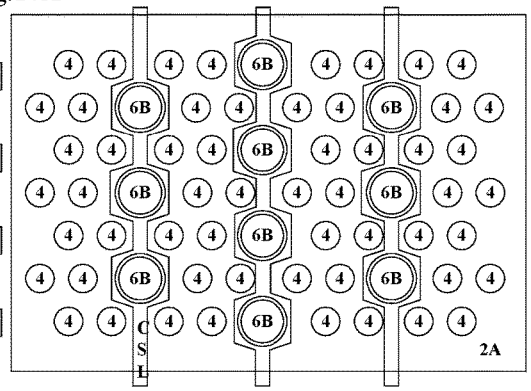

In another alternative embodiment of the present invention, in the process of removing the dummy gate layers 2B shown in FIG. 5, being different from that there is only one channel layer 4 in the line connection between two adjacent first openings 2T as shown in FIG. 5, there can be a plurality of channel layers 4 between two columns (arranged in the vertical direction in FIG. 5B) of the first openings 2T as shown in FIG. 10C, thereby the distance between the first openings 2T is increased, the layers 2B are only partially removed during the etching process to maintain part of the dummy gate layers 2B in the recesses 2R, and then the automatic isolation for the control gate is realized by the self-alignment of the dummy gate layers 2B. In other words, the side surfaces of the gate stack structures 5A/5B between two adjacent columns of channel layers 4 can have insulation isolation through the remaining second material layers 2B, leading to the enhancement of the device insulating performance.

In accordance with the three-dimensional memory manufacturing method of the present invention, the deep trenches of word-line in the TCAT three-dimensional device are replaced with deep-hole etching to realize the same function, thereby improving the integration density, simplifying the etching process of stacked structure, and maintaining the control performance of the metal gate.

Although the present invention is descried with one or more exemplary embodiments, one skilled in the art will recognize that various appropriate changes and equivalents of the device structures can be made without departing from the scope of the present invention. Furthermore, a great deal of modifications of specific situation or materials can be made to the disclosed enlightenment without departing from the scope of the present invention. Thus, the intent of the present invention is not limited to the disclosed illustrative examples for implementing the best embodiments. The disclosed device structures and the method of manufacturing the same will include all the exemplary embodiments within the scope of the invention.

The invention claimed is:

1. A method for manufacturing three-dimensional memory, comprising the steps of:
   forming a stack structure composed of a plurality of first material layers and a plurality of second material layers on a substrate;
   etching the stack structure to expose the substrate, forming a plurality of first vertical openings in an array region located in a central region, the plurality of first vertical openings being disposed in a matrix in plan view;
   forming a filling layer in each of the first openings;
   etching the stack structure around each of the first openings to expose the substrate, forming a plurality of second vertical openings arranged so that each of at least a majority of the plurality of first openings is surrounded by a symmetrical arrangement of the second vertical openings;
   forming a vertical channel layer and a drain in each of the second openings;
   removing the filling layer by selective etching, re-exposing the first openings;
   partially or completely removing the second material layers by lateral etching, leaving a plurality of recesses;
   forming a plurality of gate stack structures in the plurality of recesses;
   forming a plurality of common sources on and/or in the substrate at the bottom of each of the first openings.

2. The method for manufacturing three-dimensional memory of claim 1, wherein the first material layers, the second material layers and the filling layer have etching selectivity different from each other.

3. The method for manufacturing three-dimensional memory of claim 2, wherein the materials of the first material layers, the second material layers and the filling layer are selected from any one of silicon oxide, silicon nitride, silicon oxynitride, amorphous silicon, amorphous germanium, DLC, amorphous carbon and the combinations thereof.

4. The method for manufacturing three-dimensional memory of claim 1, wherein the size of the first openings is greater than or equal to that of the second openings.

5. The method for manufacturing three-dimensional memory of claim 1, wherein the channel layer is a hollow structure comprising an insulator in the center.

6. The method for manufacturing three-dimensional memory of claim 1, wherein after forming the common sources, further comprising forming an insulating layer on sidewalls of each of the first openings, forming a contact layer contacting the common source regions on sidewalls of the insulating layer and at the bottom of each of the first openings.

7. The method for manufacturing three-dimensional memory of claim 6, wherein during or after forming the contact layers, further comprising controlling the deposition process parameters or etching back to ensure that the top surface of the contact layer is lower than the bottom of the topmost layer of the gate stack structure, and then backfilling with the insulating layer.

8. The method for manufacturing three-dimensional memory of claim 6, wherein after forming the contact layer, further comprising partially removing the first material layers and the gate stack structure by etching to form a plurality of third openings, and depositing insulating material in each of the plurality of the third openings to form an isolation insulating region up to the topmost layer of the gate stack structures.

9. The method for manufacturing three-dimensional memory of claim 8, wherein after forming the isolation insulating region, further comprising forming an interlayer dielectric layer on the device, etching the interlayer dielectric layer to form a plurality of fourth openings until the contact layer is exposed, and then filling with metal to form a common source wiring.

10. The method for manufacturing three-dimensional memory of claim 9, wherein after forming a contact plug of the common source line, further comprising forming a second interlayer dielectric layer on the device, etching the second interlayer dielectric layer to form a plurality of fifth openings until the channel region is exposed, and then filling with metal to form a bit-line contact.

11. The method for manufacturing three-dimensional memory of claim 1, wherein before forming the first openings by etching, further comprising etching the stack structure in the word-line contact region surrounding the array area to form stairs, sequentially exposing the ends of each of the first material layers and the second material layers.

12. A method for manufacturing three-dimensional memory, comprising the steps of:
   forming a stack structure composed of a plurality of first material layers and a plurality of second material layers on a substrate;
   etching the stack structure to expose the substrate, meanwhile forming a plurality of vertical first openings as well as a plurality of second openings around each of the first openings in an array region located in a central region, the plurality of first vertical openings being disposed in a matrix in plan view and arranged so that each of at least a majority of the plurality of the first openings is surrounded by a symmetrical arrangement of the second vertical openings;
   forming a filling layer in each of the first openings;
   forming a vertical channel layer and a drain in each of the second openings;
   removing the filling layers by selective etching, re-exposing the first openings;
   partially or completely removing the second material layers by lateral etching, leaving a plurality of recesses;
   forming a gate stack structure in each of the recesses;

forming a common source on and/or in the substrate at the bottom of each of the first openings.

* * * * *